United States Patent [19]

Miller et al.

[11] Patent Number: 5,426,405
[45] Date of Patent: Jun. 20, 1995

[54] FAMILY OF DIFFERENT-SIZED DEMOUNTABLE HYBRID ASSEMBLIES WITH MICROWAVE-BANDWIDTH INTERCONNECTS

[75] Inventors: Daniel J. Miller, Millbrae; Kim H. Chen, Fremont, both of Calif.; Lewis R. Dove, Monument, Colo.; Vaddoarahalli K. Nagesh, Cupertino, Calif.

[73] Assignee: Hewlett-Packard Company, Palo Alto, Calif.

[21] Appl. No.: 366,000

[22] Filed: Dec. 29, 1994

Related U.S. Application Data

[63] Continuation of Ser. No. 101,160, Aug. 3, 1993, abandoned.

[51] Int. Cl.⁶ .............................................. H01L 23/32
[52] U.S. Cl. .................................. 333/247; 257/726; 257/727
[58] Field of Search ................. 333/246, 247; 257/664, 257/666, 675, 676, 688, 698, 700–702, 726–728

[56] References Cited

U.S. PATENT DOCUMENTS

| | | |
|---|---|---|
| 3,529,213 | 9/1970 | Farrand et al. |
| 4,381,131 | 4/1983 | Demnianiuk .............. 257/701 X |
| 4,455,537 | 6/1984 | La Prade et al. ............... 333/33 |
| 4,626,805 | 12/1986 | Jones ............................. 333/33 |
| 4,657,322 | 4/1987 | Grellmann et al. |
| 4,658,330 | 4/1987 | Berg . |
| 4,760,335 | 7/1988 | Lindberg . |
| 4,867,689 | 9/1989 | Redmond et al. .............. 439/71 |
| 4,922,376 | 5/1990 | Pommer et al. .............. 361/715 |
| 5,065,280 | 11/1991 | Karnezos et al. |
| 5,117,068 | 5/1992 | Seieroe et al. ............... 257/666 X |
| 5,278,447 | 1/1994 | Vongfuangfoo et al. ........ 257/727 |
| 5,294,897 | 3/1994 | Notani et al. ................ 333/246 X |

FOREIGN PATENT DOCUMENTS

| | | |
|---|---|---|
| 2149980A | 6/1985 | United Kingdom . |
| WO8704009 | 7/1987 | WIPO . |

*Primary Examiner*—Paul Gensler
*Attorney, Agent, or Firm*—Patrick J. Murphy

[57] ABSTRACT

A family of modular hybrid assemblies with high frequency interconnections is effected by a high frequency circuit assembly attached to a motherboard. Each assembly comprises standardized conducting elements and customizable transitions and circuit regions. The customizable transitions can be placed anywhere along the conducting element and are capable of low and high frequency performance. Attachment of the assembly can be effected via a standardized clamping structure which compresses an elastomeric member upon the conducting elements or by bending the conducting elements and soldering on end to attachment sites on the motherboard. Each member of the family of modular hybrid assemblies provides a controlled impedance transition from a transmission line on the circuit assembly to a transmission line on the motherboard.

16 Claims, 11 Drawing Sheets

FAMILY OF DIFFERENT-SIZED DEMOUNTABLE HYBRID ASSEMBLIES WITH MICROWAVE-BANDWIDTH INTERCONNECTS

CROSS REFERENCE TO RELATED APPLICATION

This is a continuation of application Ser. No. 08/101,160 filed on Aug. 3, 1993, now abandoned.

FIELD OF THE INVENTION

The present invention relates generally to high frequency interconnections and more particularly to demountable microwave and high-speed digital circuit assemblies on a substrate which contains controlled-impedance transmission lines.

BACKGROUND OF THE INVENTION

In the design and manufacture of electronic devices that are operated within the microwave frequency range, i.e., frequencies greater than 1 GHz, the electrical interconnection between circuits is of great concern. An interconnection must be treated as a controlled-impedance transmission line when the interconnection dimension becomes a significant fraction of the signal wavelength (typically 1/10 to ⅛ of the wavelength is considered significant). At microwave frequencies nearly all circuit interconnections meet this criterion and, consequently, must be designed as controlled-impedance transmission lines. Interconnections which do not match the characteristic impedance of the circuit result in signal reflections and, thus, loss of power transmission and signal integrity.

Microwave-environment transitions between circuits within an electronic device may be made by coaxial connectors which provide electrical communication between two microwave assemblies housed within separate metallic boxes. Such structures are typically used for microwave hybrid packaging up to 26 GHz. However, a separate coaxial transition is needed for each electrical signal that must be conducted between the assemblies. Additionally, the machined metallic boxes and coaxial connectors add significantly to the manufacturing cost of the electronic device.

While they are not in common use, microwave assemblies which are surface mountable to a printed circuit board are known. This technique employs a surface mountable microwave integrated circuit assembly which uses transmission lines on a printed circuit board in place of coaxial plumbing between the milled assemblies. A backside coplanar waveguide is connected via reflow soldering. One difficulty with this solder-attach technique involves the differences in the thermal coefficients of expansion of the components. These thermal coefficient differences, which occur during the solder reflow process and, subsequently, during circuit operation, induce stresses at the solder joints that are directly proportional to circuit size. Hence, larger circuits have larger stresses. When the stresses surpass the fracture stress for the solder joint, failure of the electrical contact occurs. Thus, soldered, surface-mountable, microwave circuit assemblies must be limited in size or must be used only on interconnection substrates with matched thermal expansion. Moreover, the solder-attach technique does not facilitate replacement testing of integrated circuit assemblies.

For high-speed digital circuits, the required bandwidth for interconnections can be related to the rise time of the digital pulse by the following formula:

$$BW = 0.35N/t_r$$

where $t_r$ is the digital pulse rise time and N is the highest order frequency harmonic to be passed. Values of $N=3$ to 5 are typically used to estimate an adequate interconnect bandwidth for digital pulse integrity. With pulse rise times now below 500 picoseconds in many high-speed digital designs, it is imperative to design digital circuit interconnects with microwave bandwidths.

Another feature of high-speed digital circuits is the higher integrated circuit densities which typically require a greater number of interconnections than do conventional microwave circuits. Presently, there are now high-speed digital circuits which require up to 500 high-speed signal interconnections for optimum performance. One approach to satisfy this requirement for a high density of controlled-impedance interconnects is an aggressive development of multichip modules. By placing a plurality of chips on a substrate which can provide a high density of controlled-impedance lines, multichip modules eliminate the uncontrolled-impedance interconnections associated with single chip assemblies. An additional requirement for high-speed digital circuits is the interconnection of a large number of high-speed signals to multichip modules. These signal interconnects must also have controlled impedances.

In addition to the need for controlled-impedance interconnects, microwave and high-speed digital circuit assemblies have other requirements. These requirements include: (1) isolation of high frequency circuitry from electrical interference; (2) electrical reliability; and (3) mechanical reliability. For circuits which operate with significant power, the dissipation of thermal energy through the use of heat sinks may also be a requirement. For many high frequency circuits, it is also desirable to provide a hermetically-sealed environment. It would be advantageous if high frequency assemblies could provide these requirements while also providing ease of assembly, rework, and test. Preferably, these requirements can be met at a reduced cost. Further advantages would be realized if the packaging scheme allowed for flexibility in designing custom circuits while maintaining a standardized interconnect geometry between the circuit and the printed circuit board. These advantages include shorter design cycles and lower costs through the leveraged use of standard package elements and fixtures.

It is an object of the present invention to provide a controlled-impedance interconnection between a transmission line of a high frequency circuit and a transmission line of a substrate with the above requirements and enhancements. The high frequency circuit and the substrate can each be fabricated with either thick-film, thin-film, printed circuit board or multichip module technology. The high frequency circuit and the interconnection substrate can be components of either a microwave system or a high-speed digital system.

SUMMARY OF THE INVENTION

The above-mentioned long-felt needs in the art have been met by the present invention which provides a family of different-sized hybrid assemblies each comprising standardized conducting elements and clamping structures, and customizable transitions and circuit regions. The customizable transitions can be placed anywhere along the conducting element and are capable of low and high frequency performance.

The family of different-sized hybrid assemblies is effected by an assembly which provides a controlled-impedance transition from a transmission line on a demountable, high frequency circuit to a transmission line on an interconnection substrate, such as a printed circuit board for example. Connection from a first pattern of controlled-impedance contact sites on the high frequency circuit to a second pattern of controlled-impedance contact sites on the interconnection substrate is accomplished by a plurality of conductors having at least one end brought into proper electrical communication with both patterns of contact sites by compression of an elastomeric member. The scalability of the hybrid assemblies, which results in the different-sized family members, does not adversely affect the controlled-impedance transitions.

In a preferred embodiment, the plurality of conductors are metal leads of a leadframe electrically and mechanically attached to and extending from attachment sites on a high frequency circuit. These metal leads are aligned over complementary contact sites on the interconnection substrate. A clamping structure effects electrical contact between the leads and the contact sites on the printed circuit board through the compression of an elastomer. A stiffener structure on the side of the board opposite to the clamp and elastomer maintains the planarity of the printed circuit board when the elastomer is compressed. In this transition structure, a coplanar transmission line is created when two ground leads are defined on either side of a defined signal lead on the leadframe. The impedance of the coplanar transmission line is determined by the geometries and choice of materials for the various elements of the structure. Electrical isolation of one high frequency transition from another transition is also strongly dependent upon the materials of the clamp and stiffener structures. To provide electrically isolated, controlled-impedance transitions, therefore, the materials and dimensions of the leads, attachment pads, PCB contact pads, elastomer and stiffener must be chosen based on how they effect impedance and electrical coupling.

Preferably, the metal lead geometries are designed to be similar for both ground and signal connections. Such equivalence is needed for the standardization of lead locations while providing the flexibility to design any three leads as a coplanar transition. This flexibility allows for assembly scalability. In other words, the size of the assembly does not affect the geometry of the leads, just the number of leads. Any leads not used as high frequency transitions can be used as either power, low-frequency, direct-current interconnects, or ground interconnects. Additionally, the leads can remain unused with no effect to assembly performance.

The transition structure is designed for mechanical reliability as well as electrical performance. The clamping structure applies a higher force on the high frequency hybrid circuit than on the metal leads; this minimizes the force on the metal lead's attachment area during vibration and shock. Thus, the design of the transition structure results in reliable performance.

The metal leads may be attached to either the top or bottom of the circuit where the top of the circuit is defined as the circuit side on which active and passive components are attached. Lead attach can be accomplished with solder or braze methods or with conductive epoxy. To maximize the bandwidth of the interconnection, the metal leads should extend horizontally from the circuit assembly. This lead orientation provides a well controlled electrical transition (e.g., $-20$ db return loss at 8 GHz).

Another lead orientation with a less controlled electrical environment utilizes bent metal leads. Bent leads are soldered directly to the printed circuit board and, since no clamping structure is needed, real estate and cost savings are realized. Control of electrical impedance becomes less exact because of the discontinuities due to the bent leads and the difficulty in controlling the dimensions of bent leads. Yet, bent metal leads may provide up to 4 GHz bandwidth transitions.

This demountable, controlled-impedance interconnection design can be used with high frequency circuits made with thick film, or thin film technology. The transition structure can also be used with multichip modules made with ceramic or laminate technology or with thin-film deposited technologies on multi-layer ceramic. If electrical shielding or an hermetic environment is desired, features of the controlled-impedance structure on the high frequency circuit will depend on the particular packaging technology employed. When the high frequency circuit is made with thick-film technology, novel thick-film features, such as isolation walls, may be needed to achieve an hermetic environment and/or good electrical shielding.

DETAILED DESCRIPTION OF THE PREFERRED EMBODIMENT

Broadly, the present invention provides a family of high performance, low cost, demountable thick film assemblies which can be easily designed, re-worked and manufactured. The claimed packaging technology results in a lower per-unit product cost, as well as lower overall system costs. Development cycles have been significantly shortened in comparison to fully custom microcircuits without sacrificing customizable freedom.

This is due in part to the introduction of standardized elements and a demountable mechanical assembly.

Figure 1:
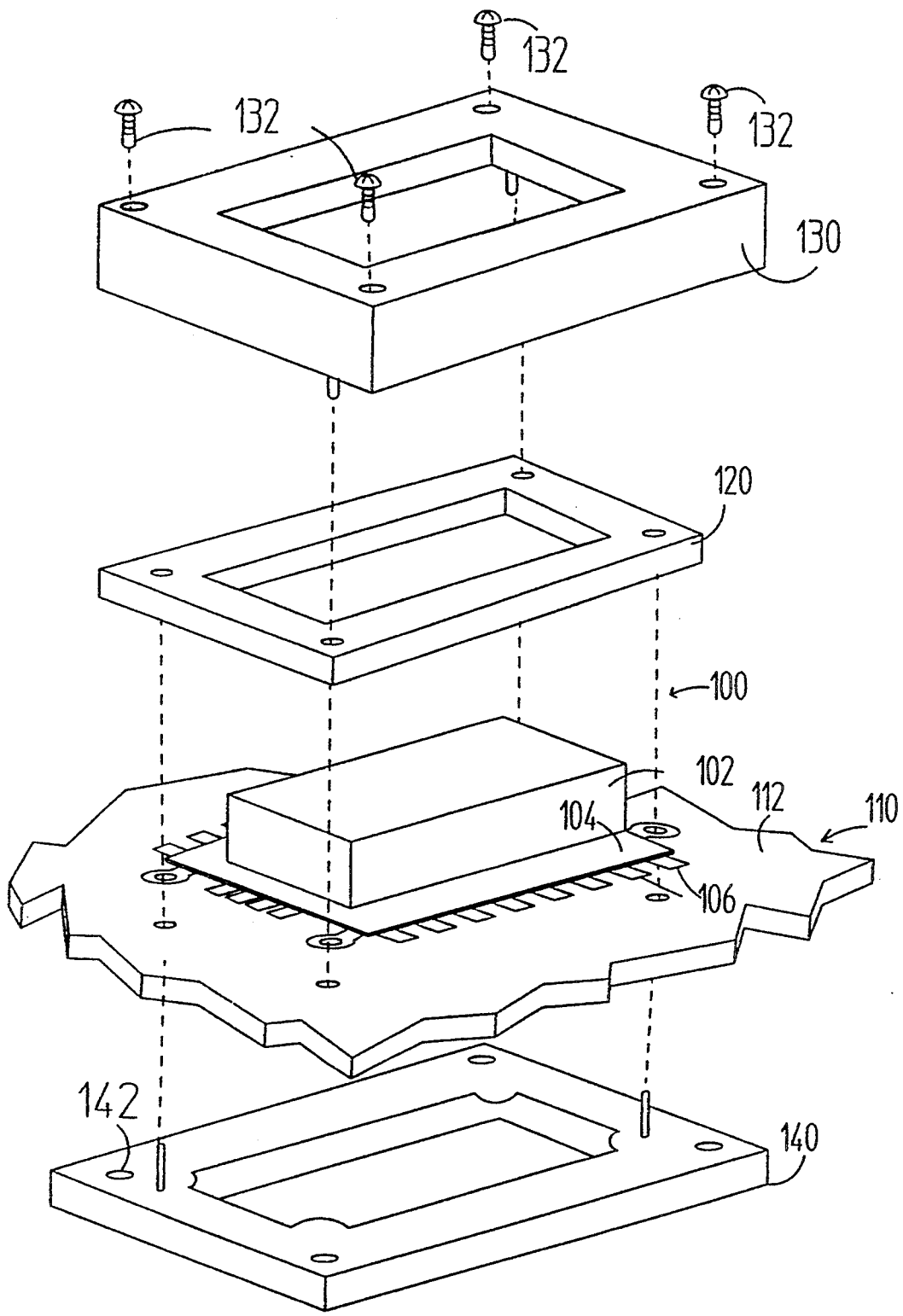
FIG. 1 shows an exploded view of a modular hybrid assembly according to the present invention.

FIG. 1 shows an exploded view of the modular hybrid assembly. The high frequency circuit 100 is comprised of a customized microcircuit affixed to a customizable region (not shown) and is encased within an isolation lid 102, as well known in the art, which can be made of Kovar for example. The lid 102 offers mechanical protection to the customized microcircuit, as well as electrical isolation and hermetic sealing. A leadframe has conductive leads 106 protruding horizontally from the bottom of a high frequency substrate 104 which maximizes the bandwidth of the interconnection. The leadframe is typically comprised of an alloy with a thermal coefficient matched to the coefficient of the assembly. The conductive leads 106 are placed in frictional contact with a multi-layered printed circuit board 110 which has conductive coating 112 laminated and patterned upon the surface of the board 110. This planar launch embodiment has the advantages of controlled-impedance transitions and easy mounting/demounting of the high frequency circuit 100. In a preferred embodiment, the modular hybrid provides up to 8 GHz bandwidth transitions with only −20 db return loss.

The high frequency substrate 104 can be made of a ceramic composite such as alumina, for example. The customizable region can accommodate a variety of components such as thick-film, thin-film and co-fired ceramic circuitry. For example, thick-film components can be fabricated directly upon the customizable region. These thick-film components can then be either passively or actively trimmed to a wide range of values resulting in passive elements (e.g., resistors, inductors, capacitors). Active components such as bare silicon, or gallium arsenide, integrated circuits can be attached to the substrate 104 within the customizable region via wire, ribbon or mesh bonding. Surface mount components can be soldered to the customizable region directly. Indeed, customizable circuitry can utilize chip, wire and SMT assembly in any combination within the same customizable region.

The conductive coating 112 laminated and patterned on the surface of the printed circuit board 110 should be gold-plated thick enough to satisfy signal integrity requirements, yet thin enough to avoid inter-metallic formation when components, other than the high frequency circuit 100, are soldered directly upon the board 110. In a preferred embodiment, the gold-plating is a 5 microinch flash of gold which is placed across the entire board 110. This eliminates the need for selective gold plating which would increase production costs and manufacturing time.

In a preferred embodiment, the high frequency circuit 100 is held securably in place upon the printed circuit board 110 by a mechanical clamping structure which is comprised of an elastomeric member 120, a top clamp 130, a stiffener 140 and clamping screws 132. Briefly, this clamping structure provides reliable electrical and mechanical interconnections between the circuit 100 and the printed circuit board 110. One advantage of this mechanical clamping structure is the ease with which package disassembly can be effected. This facilitates rework and field replacement since use of a clamping structure obviates conventional soldering and gluing techniques typically used to attach assemblies to a motherboard.

As indicated above, the clamping structure is formed of an elastomeric member 120, a top clamp 130, a stiffener 140, and clamping screws 132. This mechanical structure provides support for one part of the controlled-impedance transition for the modular hybrid. An important feature of the present invention is the controlled-impedance interconnection between high frequency signal paths on the circuit 100 and the motherboard 110. With the clamping structure in place over the circuit assembly 100, a coplanar waveguide transmission line is formed where two ground traces are defined on either side of a high frequency signal trace on the leadframe. The controlled-impedance interconnections will be described more fully below.

Proper electrical contact is ensured by using the top clamp 130 to compress the elastomeric member 120 against the outer ends of the plurality of conductors 106. This compression forces the circuit assembly 100 into frictional, and therefore electrical, contact with the motherboard 110. The clamping structure is held in place by attachment to the stiffener 140 which is on an opposed side of the motherboard 110. In addition to holding the clamping structure and circuit assembly 100 securely in place, the stiffener 140 maintains the planarity of the motherboard 110. The stiffener 140 must be strong enough to provide the needed support while offering a slim profile due to limited space requirements. In the preferred embodiment, the stiffener 140 is made of high-strength carbon steel and is available from California Fineblanking Corporation, 5803 Engineer Drive, Huntington Beach, Calif. 92649.

A minimum contact pressure is required around the entire perimeter of the circuit assembly 100 for the life of the product. This requirement is satisfied by a glass-filled plastic clamp, which also facilitates electrical isolation and mechanical reliability. In the preferred embodiment, the top clamp 130 is made of polycarbonate plastic with a 40% glass fill and is available from Camtex Corporation, 3075 Osgood Court, Fremont, Calif. 94539. This clamp composite will ensure that no electrical paths exist directly above the modular hybrid assembly that would degrade the assembly isolation. Further, a glass-filled plastic is sufficiently strong enough to resist bowing and has a long-term resistance to creep.

The elastomeric member 120 should have beneficial thermal and mechanical properties while resisting system environmental problems, such as moisture and chemical agents. For these reasons, the elastomeric member 120 may be made of silicone. In a preferred embodiment, the elastomeric member 120 is 747U Silicone, available from Rubber Development Incorporated, 426 Perrymont Avenue, San Jose, Calif. 95125. Additionally, enough force must be applied to the plurality of conductors 106, the substrate 104 and the motherboard 110 in order to prevent relative displacement between these elements. If the elastomeric member 120, together with the remaining elements of the clamping structure, did not provide adequate force, mechanical shock and vibrations could cause failure of the leadframe solder joints or create signal distortions within the coplanar waveguide transmission line or both.

Another important feature of the present invention is the scalability of the modular hybrid assembly which can be effected without adversely affecting assembly performance. Electrical performance reliability is maintained regardless of assembly size. Preferred embodiments of the high frequency substrate have x-y dimensions of 1.50"×1.00" and 3.65"×3.65". Other sizes, e.g., 1.50"×2.50" and 2.00"×3.00", are possible. Scalability of the modular hybrid assembly is accomplished due in part to the standardized conducting elements and clamping structures. Standardization provides quick turn around on new designs; the assembly designer need only be concerned with the customizable circuit and input/output paths. Hence, sealability of the modular hybrid assembly is easily accommodated.

Figure 2:
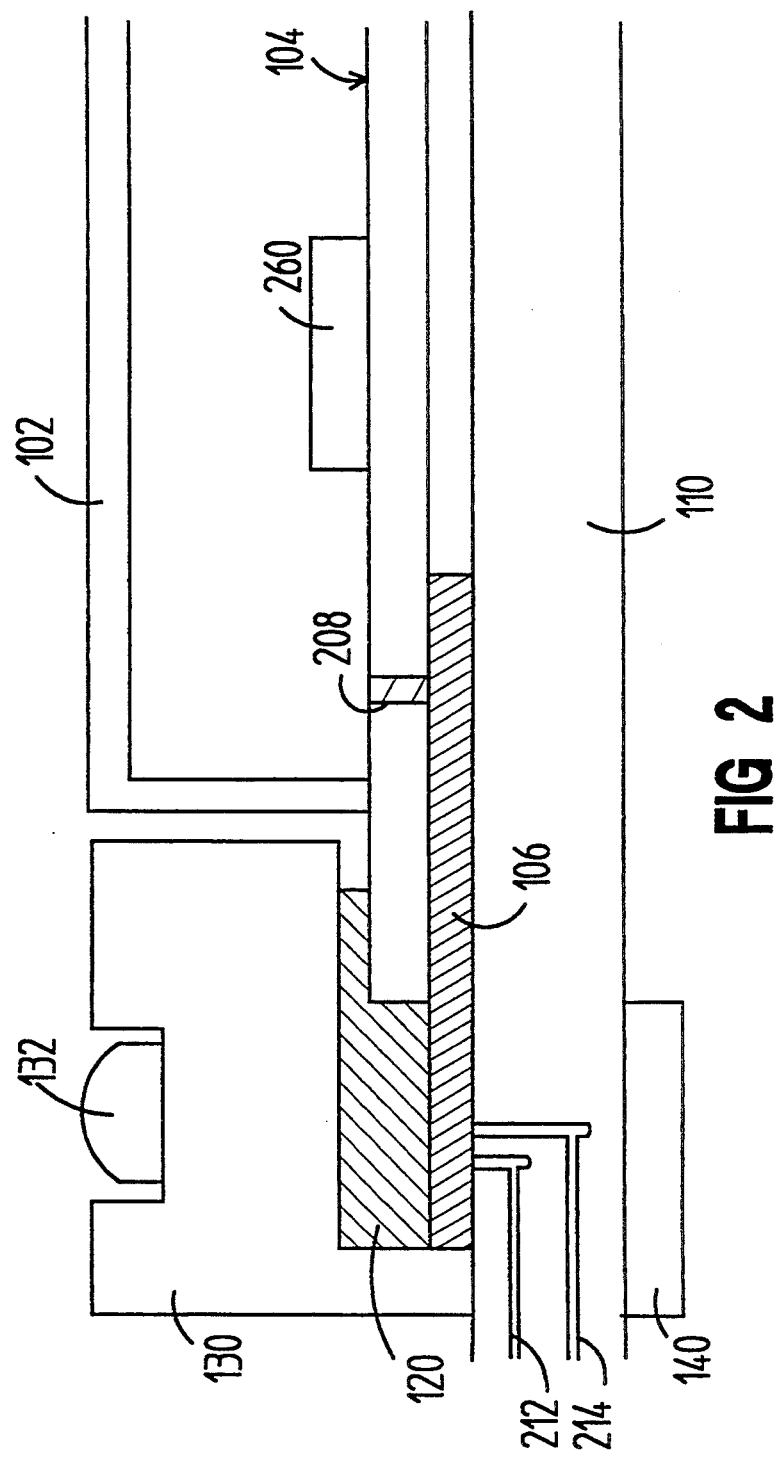
FIG. 2 shows a cross-sectional view of a low-power design of the modular hybrid assembly according to the present invention.

FIG. 2 presents a cross-sectional view of a low-power design of the modular hybrid assembly. The top-side of the substrate 104 serves as the foundation for the customizable region wherein various circuit elements are affixed, for example an integrated circuit 260. The customizable region, or the top-side of the substrate 104, is electrically coupled to the leadframe 106 through a signal printed through-hole (PTH) 208, which is typically glass-encased. The leadframe is further coupled to the outside world through a stripline transmission line comprising a signal lead 212 and a ground lead 214. For high frequency operation, an RF input signal comes onto the modular hybrid assembly through the stripline transmission line 212, 214, to the coplanar waveguide within the leadframe 106, up the PTH 208, and onto a microstrip transmission line (not shown) which is disposed on the top of the substrate 104.

Figure 7:
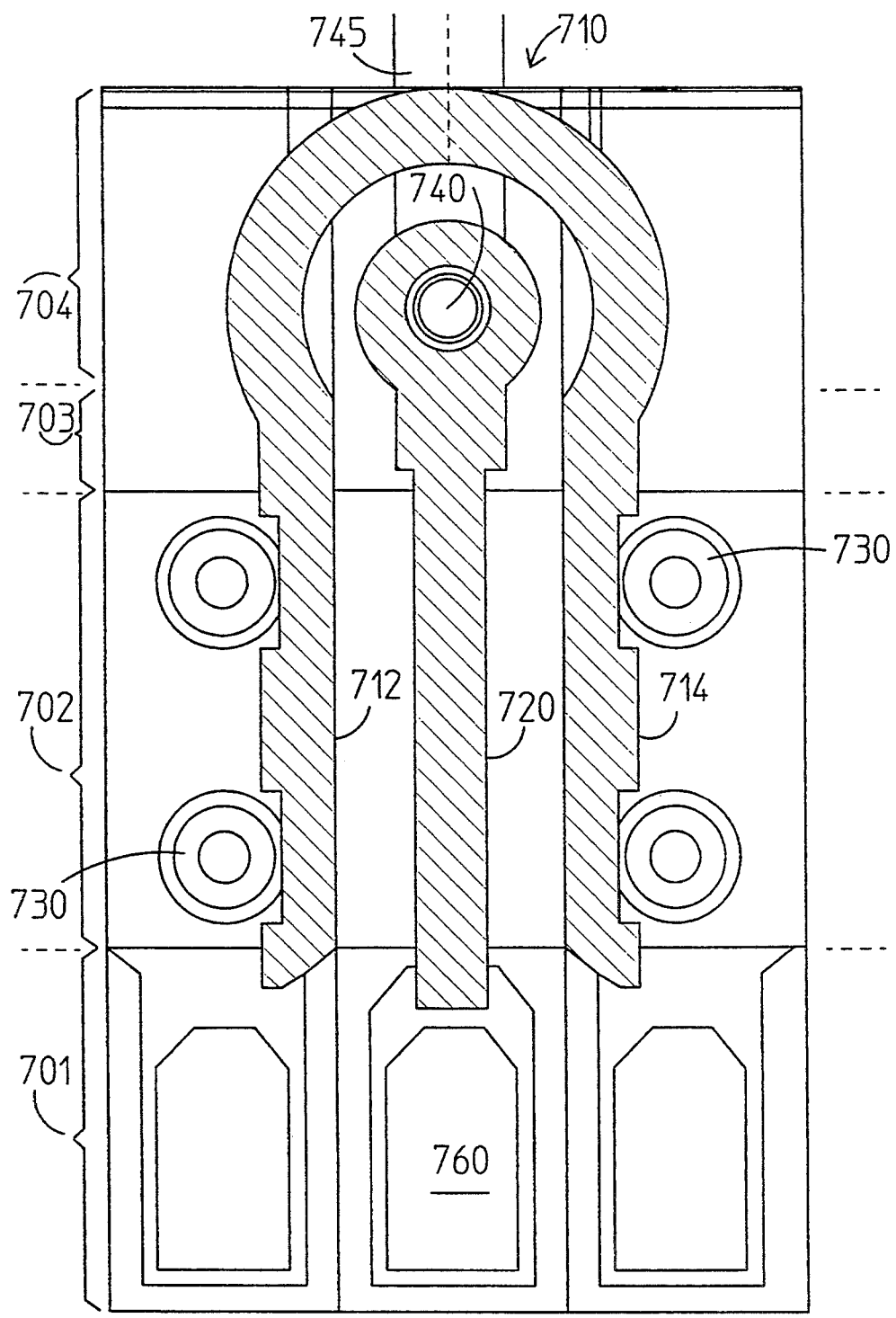
FIG. 7 shows an RF input conductive pattern on the back of the high frequency substrate.

The area between the bottom of the substrate 104 and the printed circuit board 110, wherein the leadframe 106 resides, is designed to behave as a coplanar waveguide transmission line when at least two ground leads are defined on either side of a defined signal lead on the leadframe 106 (as shown in FIG. 7). The coplanar waveguide transmission line is one of the controlled impedance transitions of the present invention. This transition is achieved via the mechanical and electrical transition created by the clamping structure.

The top clamp 130 can be seen compressing the elastomeric member 120 upon the substrate 104 and the leadframe 106. The stiffener 140 and clamping screw 132 hold the clamping structure securely in place. In a preferred embodiment, the clamping screw 132 is torqued down to 5 lb-in. This torque ensures sufficient torque retention to compensate for any thermal aging effects (e.g., loss of elastomeric compression, loss of clamping resilience).

Figure 3:
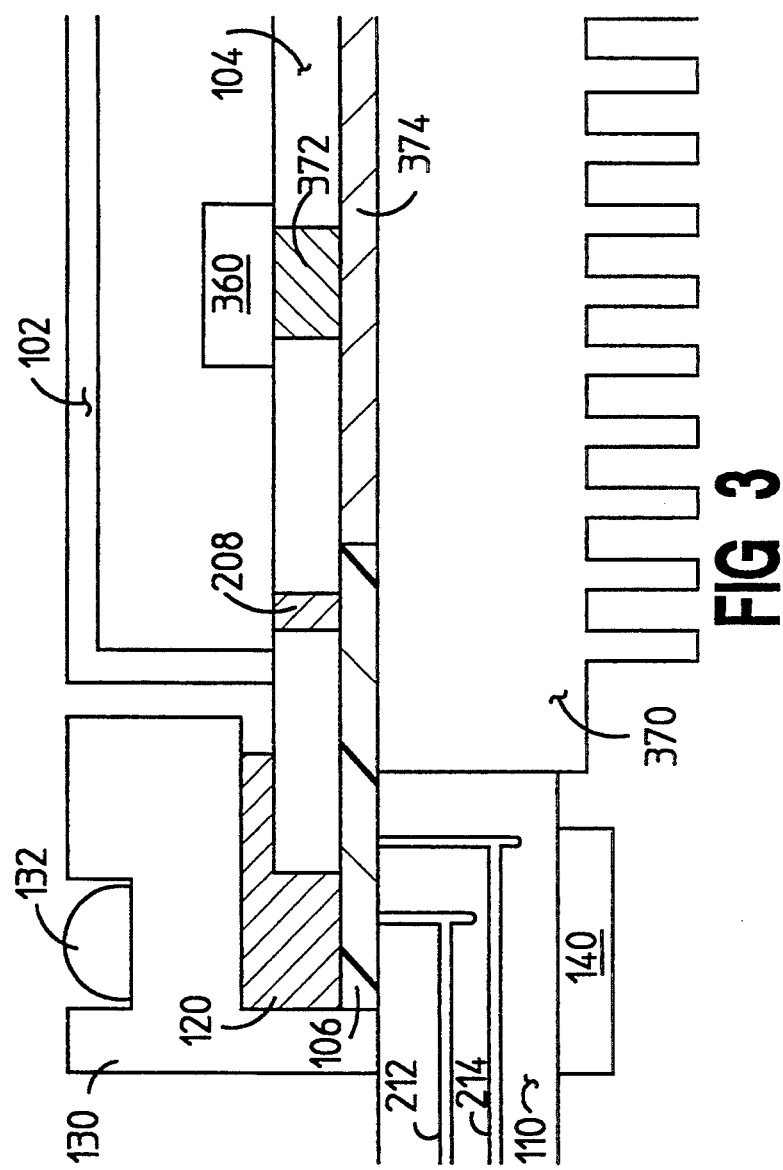
FIG. 3 shows a cross-sectional view of a high power modular hybrid assembly according to the present invention.

A high-powered design can be effected with the additional use of a heat sink as illustrated in FIG. 3. In a preferred embodiment, the heat sink 370 is attached to the back of the substrate 104 by an epoxy which, besides being easily controllable during application, aids in the thermal transfer from a high-powered integrated circuit 360 to the heat sink 370. While it is not necessary for heat dissipation, a heat stud 372 can be embedded in the substrate 104, in direct planar contact with the high-power integrated circuit 360, to facilitate thermal transfer. The heat stud 372 provides a direct energy path from the integrated circuit 360 to the top-side of a heat pedestal 374, which in turn directs energy to the heat sink 370. The heat sink 370, which can be formed of aluminum for example, is perpendicularly attached to the back-side of the heat pedestal 374 by epoxy.

Figure 4:
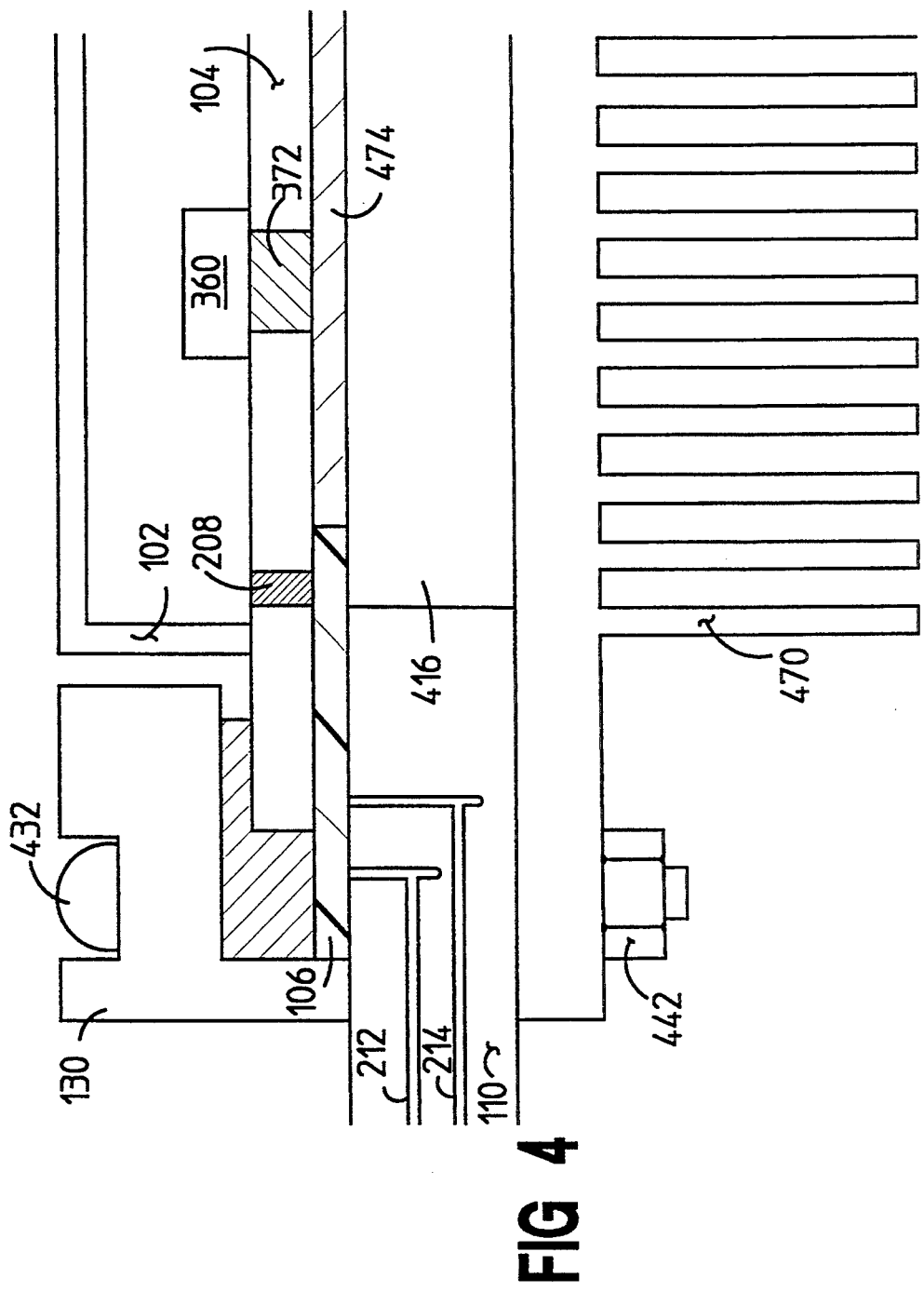
FIG. 4 shows a second cross-sectional view of a high power modular hybrid assembly according to the present invention.

In another preferred embodiment, and particularly useful for very high-powered manifestations of the modular hybrid assembly, a large heat sink 470 can be clamped directly onto the motherboard using attachment bolts 432, in conjunction with nuts 442, as shown in FIG. 4. In this embodiment, a thermal grease is placed between the heat sink 470 and the pedestal (not shown) to aid in the thermal dissipation. When constructing any of the aforementioned high-power designs, a hole 4 16 is created in the printed circuit board 110, as well known in the art, to provide a thermal dissipation channel from the customized circuit region located on the top-side of the substrate 104 to the outside world.

Figure 5:
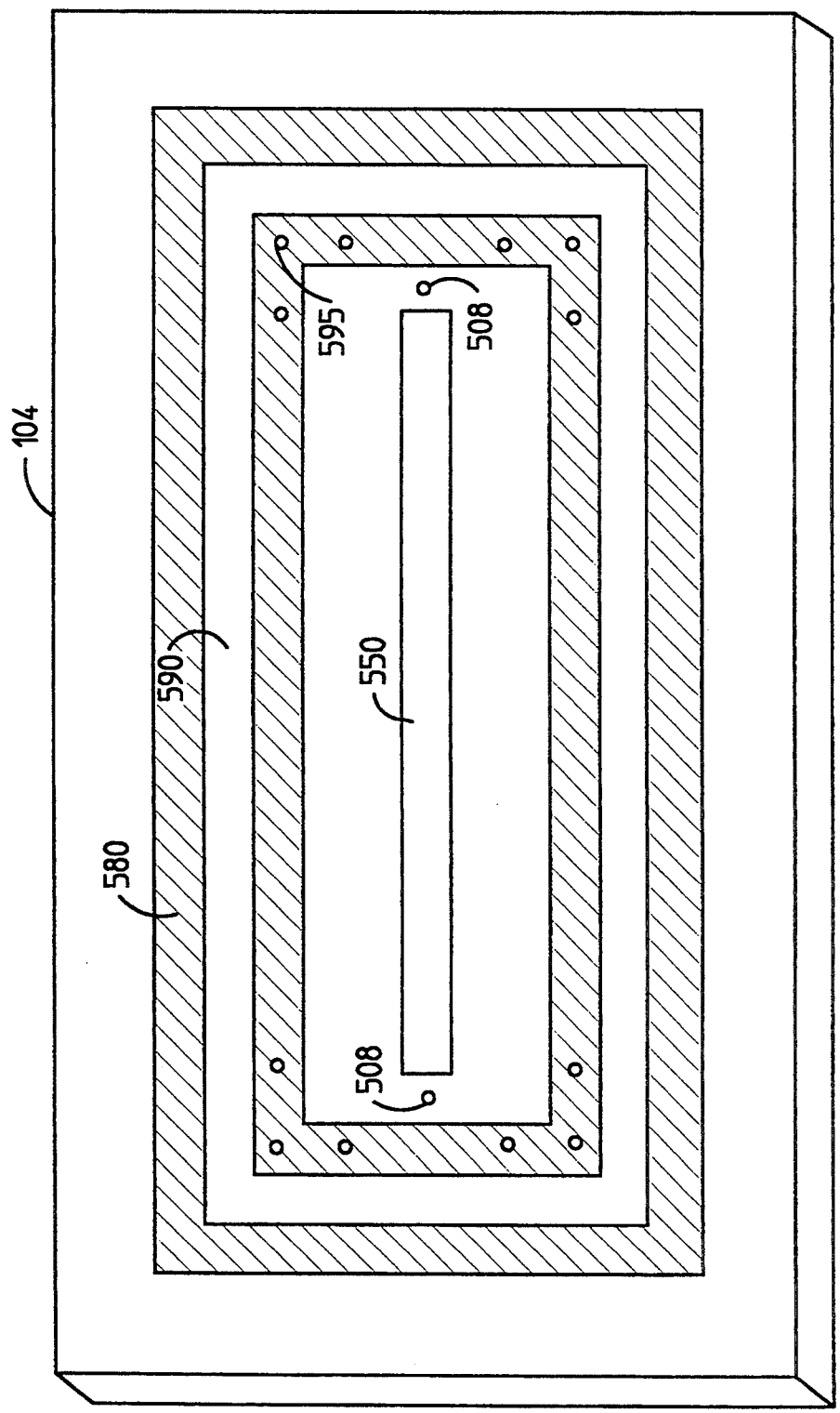
FIG. 5 presents a top-side view of the high frequency substrate structure according to the present invention.

FIG. 5 presents a top-side view of the high frequency substrate 504. A grounded lid seal ring 580 is provided. The grounded lid seal improves electrical isolation when the isolation lid (not shown) is connected via conductive epoxy to the top-side of the substrate 104 at a nominal location 590. In a preferred embodiment, the grounded lid seal ring has a width of 120 mils. This seal ring width, together with an isolation lid attachment surface of 60 mils (i.e., the width of the isolation lid is approximately 15 mils and then is ranged for attachment), yields stable electrical performance of the modular hybrid assembly while providing at least $+/-40$ mils lid tolerance. This lid tolerance accommodates variations in lid placement which are expected during manufacturing. Also, a sufficient lid tolerance removes any potential epoxy runout problem which could alter electrical performance of the modular hybrid assembly. The grounded lid seal ring 580 is formed of gold. Printed through holes 595 are placed along the grounded lid seal ring to increase isolation of the high frequency circuit assembly. These printed through holes 595 are disposed within the isolation lid, i.e., inside the perimeter of the nominal location 590, and extend through the high frequency substrate 504 to the bottom-side ground conductor pattern.

Figure 6:
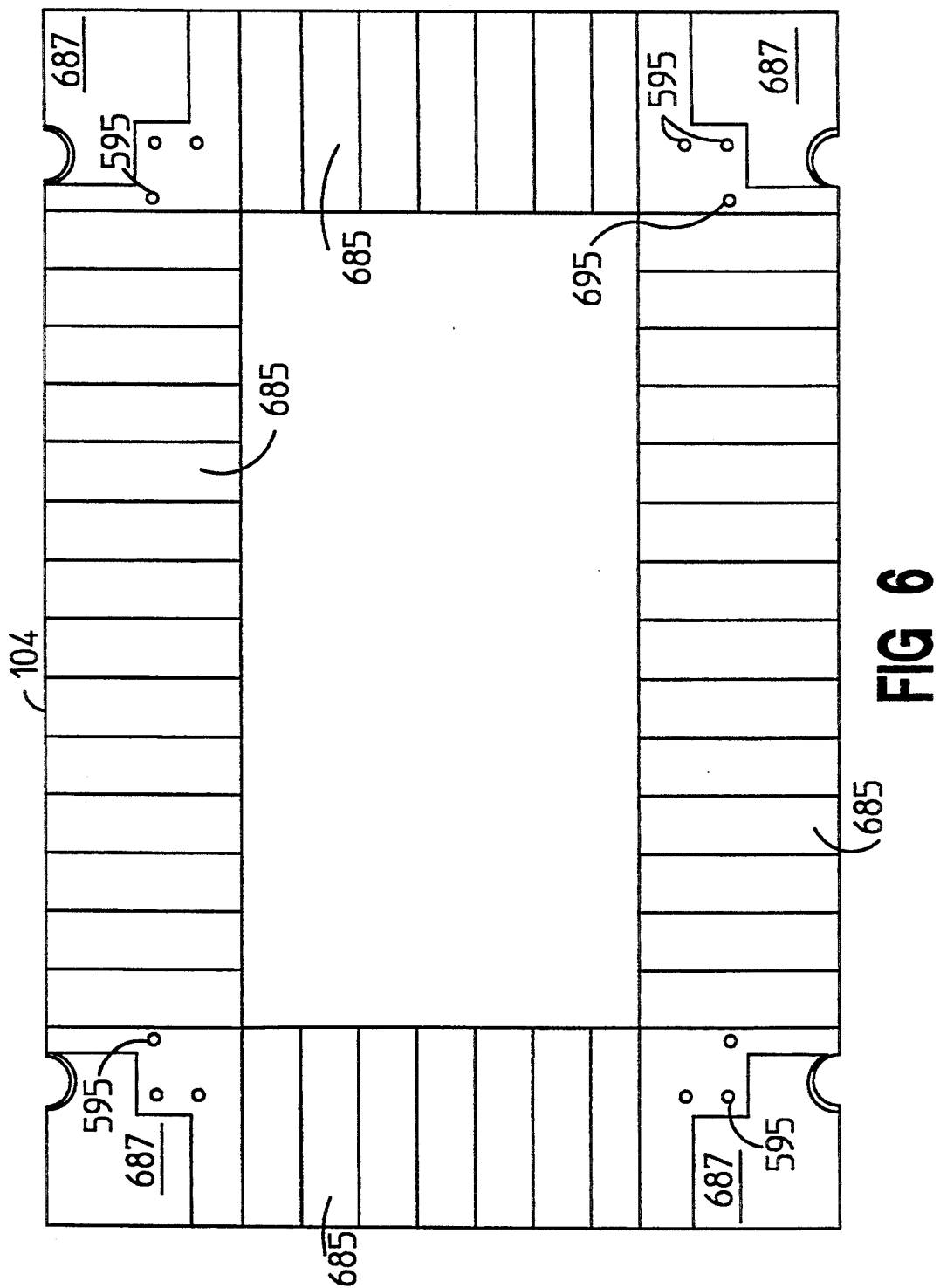
FIG. 6 presents a bottom view of the high frequency substrate according to the present invention.

FIG. 6 presents a bottom view of the high frequency substrate 104. A back-side conductor pattern, comprising a plurality of customizable design footprints 685, defines the bottom of the substrate 104. In a preferred embodiment, the conductive pattern is formed of a composite of platinum, palladium and silver (PtPdAg). Gold can be used in place of PtPdAg, especially where lower signal loss and better control of line geometry are needed.

The printed through holes 595 correspond to the printed through holes seen in FIG. 5. The corner regions 687 of the thick film are needed to provide additional surface area for secure attachment of the leadframe to the substrate 104. The leadframe can be comprised of four separate leadframe strips or can be a single integrated frame. Using four separate strips decreases the amount of material needed to fabricate a leadframe and reduce cost.

As discussed above, the plurality of design footprints 685 are fully customizable. One of the unique features of the modular hybrid assembly is that any one of the plurality of design footprints can be used for one of many functions. Functions include RF signal, ground signal, DC signal and low frequency signal. Additionally, the footprint may be electrically unused.

FIG. 7 shows an RF input conductive pattern on the back of the high frequency substrate for a thick-film embodiment of the modular hybrid. A signal trace 720 is substantially encased by a ground pattern 710, creating a coplanar waveguide. The geometries of the signal trace 720 and ground pattern 710 are specified to maintain the characteristic impedance when the traces are compressed between the substrate and the printed circuit-board.

FIG. 7 can be viewed as an aggregation of four transitions. In the first transition 701, the signal trace 720 comprises the beginning of an elongated section that begins at a leadframe attachment pad 760. The second transition 702, in which the signal trace 720 continues as an elongated section, is disposed under the grounded isolation lid which is attached on the top-side of the substrate. In the third transition 703, the signal trace 720, which is a now a stub length, can be widened since this transition 703 is no longer disposed beneath the isolation lid and, hence, there is less capacitive coupling. The fourth transition 704 begins where the signal trace 720 becomes circular to accommodate the signal printed through hole (PTH) 740.

The ground pattern 710 approximates the signal trace 720. Through the first three transitions 701, 702, 703 the ground pattern 710 comprises two elongated sections on either side of and at a relative distance from the signal trace 720. This is followed by an arc-shaped portion in the third transition 703 which has the same center point as the circular portion of the signal trace 720 while maintaining the relative distance.

In a preferred embodiment, the signal trace 720 is 18 mils wide and is positioned 19 mils from each ground trace 712, 714. The signal 720 and ground 712, 714 traces are effected by a gold overlap on the platinum-palladium-silver metalization, which provides a +/−2 mils line width tolerance during manufacturing. Gold, by itself, can be used instead, as well as a PtPdAg metalization.

As mentioned above, the signal trace 720 begins at the leadframe input 760 and terminates at a signal PTH 740. The signal trace 720 is necked down from the leadframe input 760 to compensate for capacitive effects of the grounded isolation lid which is disposed on the top-side of the substrate. The signal PTH 740 electrically connects the signal trace 720, on the back of the substrate, to the microstrip transmission line 745 on the top of the substrate.

Four grounded printed through holes (PTHs) 730 are positioned along the ground traces 712, 714, tying these traces to the grounded lid seal ring on the top of the substrate. These grounded PTHs 730 prevent signal leakage through the substrate edge and mark a transition from the coplanar waveguide to a grounded coplanar waveguide which exists under the isolation lid.

An RF input reaches the high frequency circuit (not shown) affixed to the top of the substrate via the signal trace 720, or coplanar waveguide, and microstrip transmission line 745. A feature of the present invention is that the various interconnections (e.g., from the leadframe attachment 760 to the signal trace 720; and from the signal trace 720 to the signal PTH 740) all have a characteristic impedance as will be discussed more fully below with respect to FIG. 9. In a preferred embodiment, the characteristic impedance of the modular hybrid assembly is 50 ohms.

Figure 8:
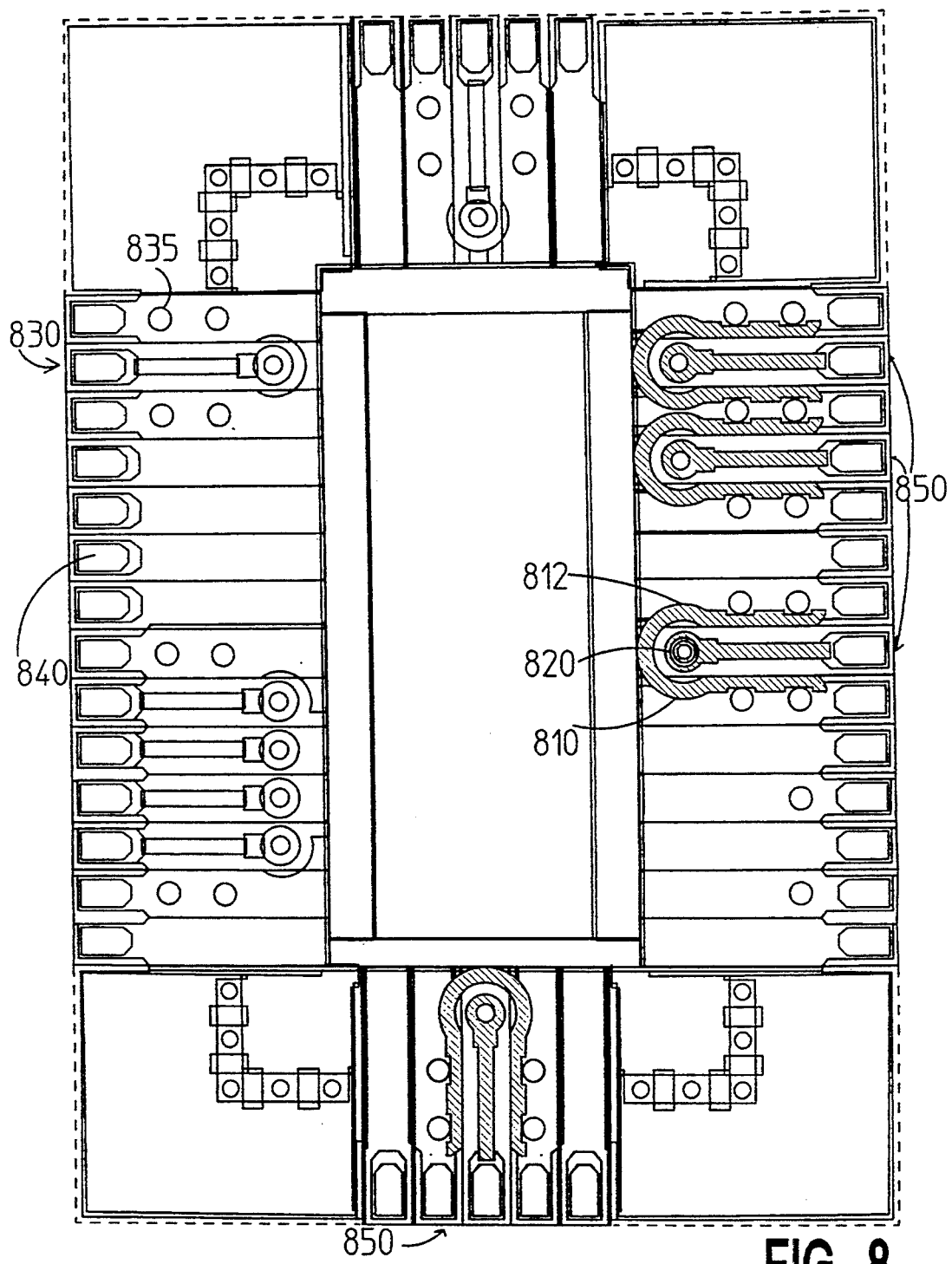
FIG. 8 shows a representative hybrid input/output arrangement.

FIG. 8 shows a representative hybrid input/output arrangement. Four high frequency RF signal inputs 850 are illustrated (these inputs are similar to the input of FIG. 7). As discussed above, customization of the assembly inputs is a feature of the present invention. The four RF signal inputs 850 illustrate that these instances can be placed anywhere along the leadframe, so long as there are three free leads available to define the two ground traces 810, 812 around a signal trace 820.

Low frequency inputs 830 are defined along the leadframe and are isolated by ground leads 835. The ground leads 835 can have one or two printed through holes to tie these leads 835 to the grounded lid seal ring (not shown) on the top of the substrate. The low frequency inputs 830 can also be DC inputs.

Figure 9:
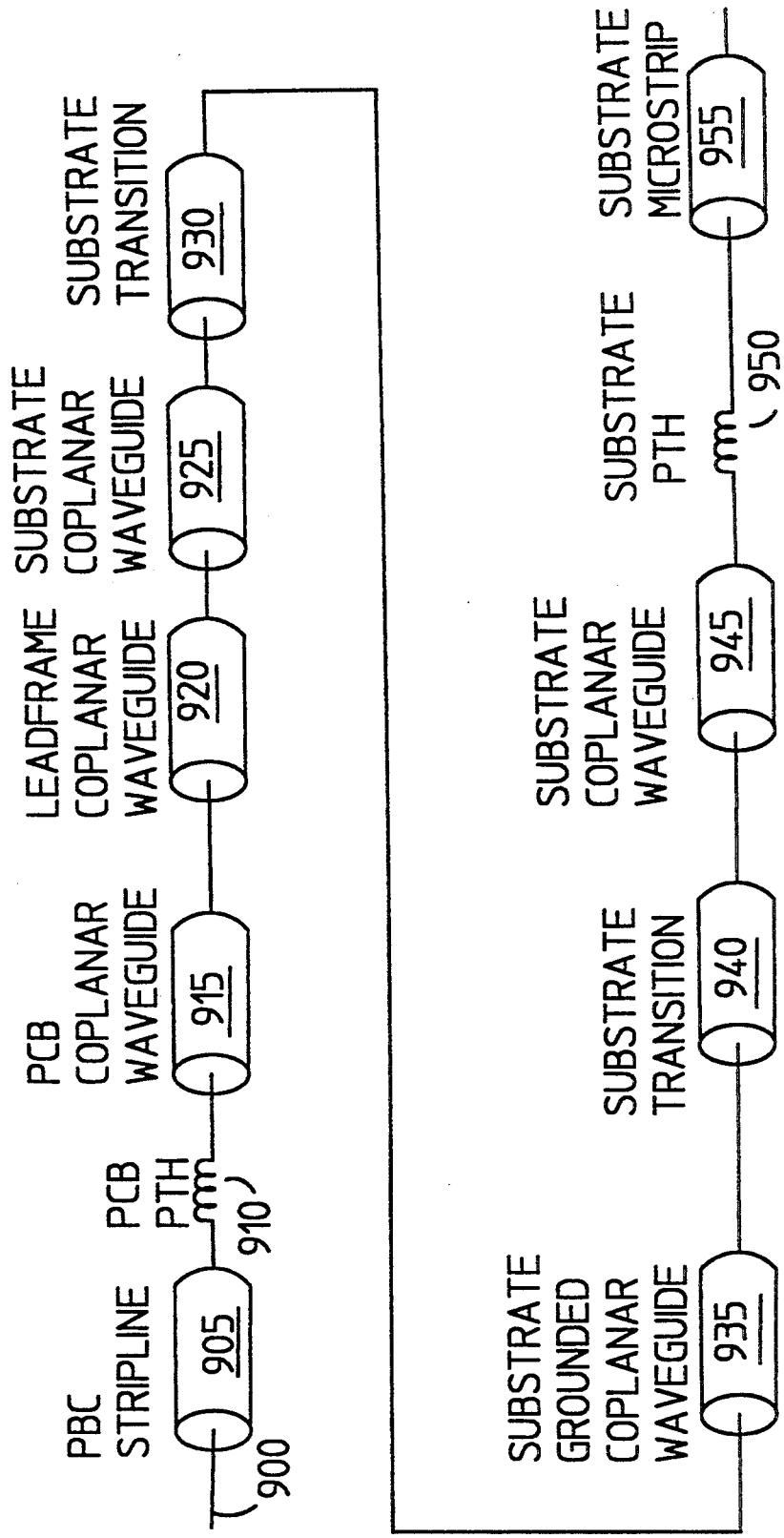
FIG. 9 shows a representative model of the input path for an RF signal to the modular hybrid assembly.

FIG. 9 shows a representative model of the input path for an RF signal to the modular hybrid assembly. Each interconnection/transition has a characteristic impedance; in a preferred embodiment, the entire impedance from end-to-end is 50 ohms. The RF input signal 900 travels along a stripline transmission line 905 on the motherboard, through a printed through hole 910. A microstrip or coplanar waveguide could be used in place of the stripline transmission line 905. On top of the motherboard, and under the high frequency substrate, the RF input is carried through a coplanar waveguide on the motherboard 915, through a leadframe coplanar waveguide 920, through the substrate coplanar waveguide 925, under a first edge of the isolation lid represented by the substrate transition 930. Once the RF input passes under the grounded isolation lid, it travels along the grounded coplanar waveguide of the substrate 935, across another substrate transition region 940 under the second edge of the isolation lid, through the end of another substrate coplanar waveguide 945 before going up a printed through hole on the substrate 950 to the microstrip transmission line 955 on the top of the substrate.

Figure 10:
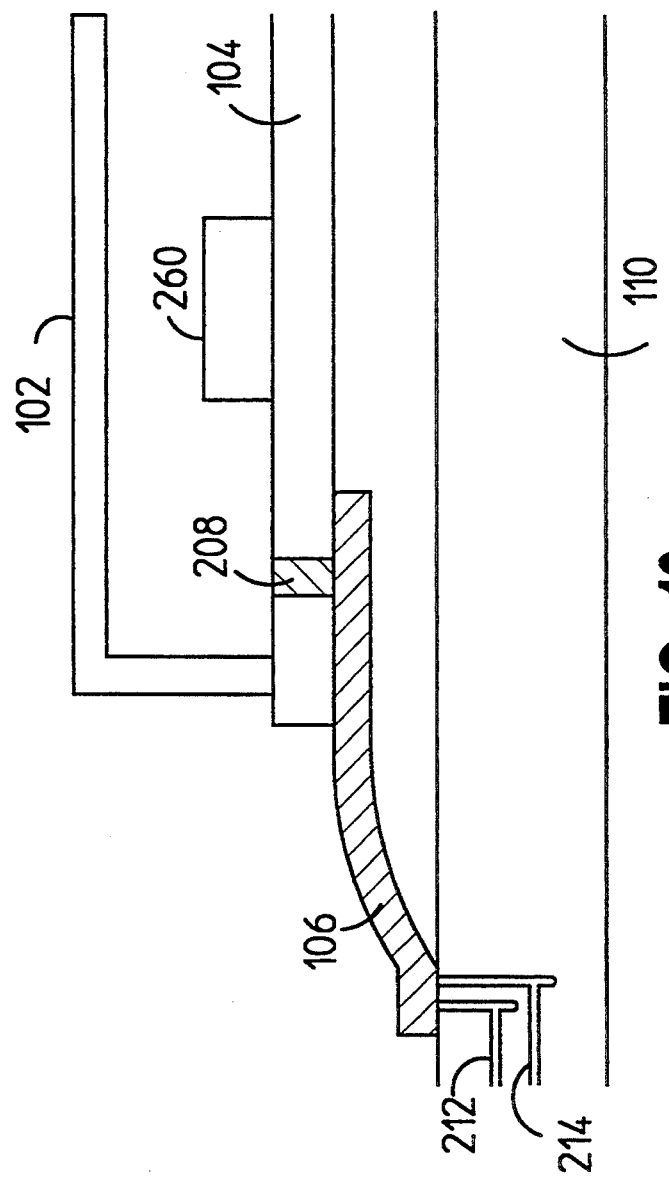
FIG. 10 shows an alternate embodiment of the present invention wherein the modular hybrid assembly is attached to a motherboard via bent leads.

FIG. 10 shows an alternate embodiment of the present invention wherein the modular hybrid assembly is attached to a motherboard via bent leads. This "gull-winged" approach has several benefits including increased stress relief between the modular hybrid assembly and the motherboard, increased space on the motherboard and less overall cost, these benefits achieved when the clamping structure is removed. Controlled impedance is still maintained, with performance realized to approximately 4 GHz.

The top-side of the substrate 104 serves as the foundation for the customizable circuit region wherein various circuit elements can be affixed, for example an integrated circuit 260. A conductive through-hole 208 electrically connects the top-side of substrate 104 and the leadframe 106. The leads of the leadframe 106 are bent downwards to create a gull-wing which is connected via solder to the printed circuit board 110. In this manner, no clamping device is needed so that board real estate is increased.

Figure 11:
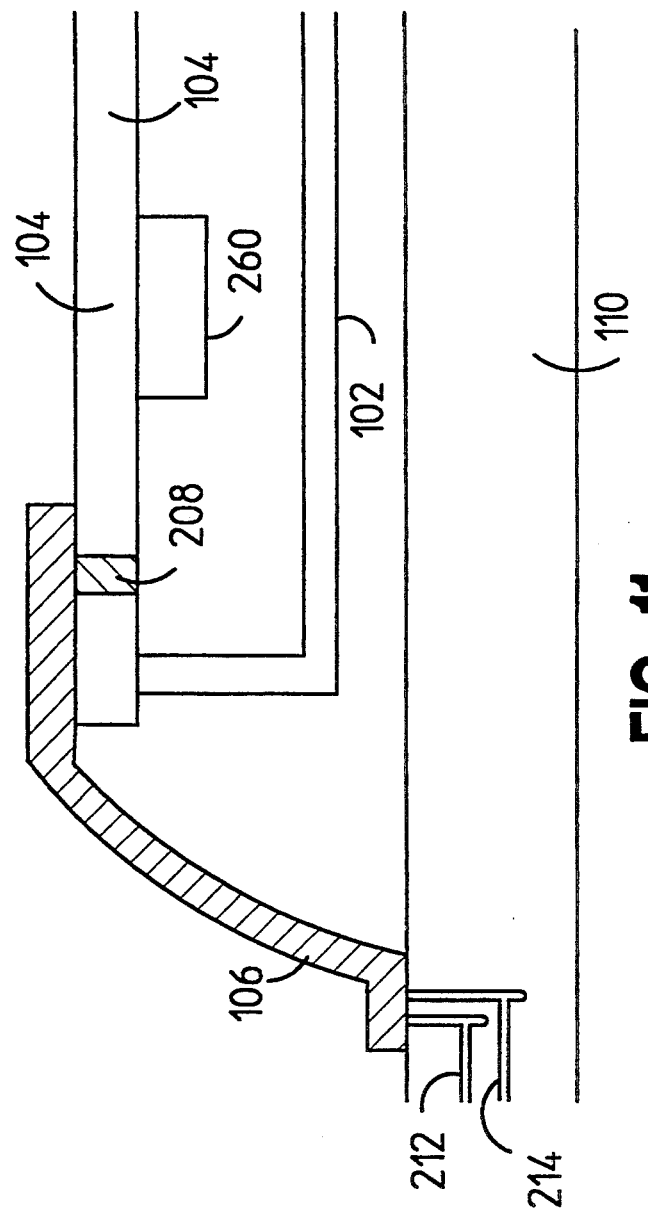
FIG. 11 shows another alternate embodiment of the invention.

Furthermore, the leads can be bent upwards so that the modular hybrid assembly is attached with the bottom-side of the substrate 104 being exposed as shown in FIG. 11. This configuration facilitates heat sink attachment directly to the substrate (not shown) when space beneath the printed circuit board is limited and space above the board is available.

While the present invention has been illustrated and described in connection with the preferred embodiments, it is not to be limited to the particular structures shown. It should be understood by those skilled in the art that various changes and modifications may be made within the purview of the appended claims without departing from the true scope and spirit of the invention in its broader aspects.

We claim:

1. A high frequency modular hybrid assembly demountably attachable to a motherboard, comprising:
   a high frequency substrate having a first surface, a second surface opposed to the first surface and having a customizable circuit region, and an edge;
   a leadframe attached to the first surface of the high frequency substrate, the leadframe having a plurality of conductors, the plurality of conductors extending horizontally from the edge and first surface of the high frequency substrate;

conductive means for electrically connecting the customizable circuit region and a plurality of signal lines on the motherboard, the conductive means being customizable and having a predetermined controlled impedance; and a clamping structure which demountably attaches the high frequency substrate to the motherboard.

2. The modular hybrid assembly according to claim 1, wherein the conductive means comprises:

at least one conductive through-hole perpendicularly positioned between the first and second surfaces of the high frequency substrate, at least one coplanar transmission line disposed between the first surface of the substrate and the motherboard, said at least one coplanar transmission line electrically connected to said at least one conductive through-hole, and means for electrically connecting said at least one coplanar transmission line and the plurality of signal lines on the motherboard.

3. The modular hybrid assembly according to claim 2, wherein said at least one coplanar transmission line is formed by first and second ground traces and a signal trace disposed therebetween, the first and second ground traces being parallel and geometrically similar to the signal trace.

4. The modular hybrid assembly according to claim 3, wherein the predetermined controlled impedance of the conductive means is 50 ohms.

5. The modular hybrid assembly according to claim 4, wherein the modular hybrid assembly maintains the predetermined controlled impedance for signals less than or equal to 8 Ghz.

6. The modular hybrid assembly according to claim 1, further comprising a high-powered circuit affixed to the customizable region and a heat sink connected to the first surface of the high frequency substrate.

7. The modular hybrid assembly according to claim 1, wherein the leadframe is formed of an alloy matched to the thermal coefficient of expansion indicative of the assembly.

8. The modular hybrid assembly according to claim 1, wherein the clamping structure comprises:

a top clamping member disposed above the motherboard and having a rectangular aperture for substantially encasing the modular hybrid assembly;

a stiffener disposed below the motherboard and modular hybrid assembly, the stiffener being attached to the top clamping member by attachment means; and an elastomeric member located between the top clamping member and the modular hybrid assembly and having a rectangular aperture, the elastomeric member providing sufficient compression force upon the plurality of conductors when the top clamping member and the stiffener are attached.

9. The modular hybrid assembly according to claim 8, wherein the attachment means comprise at least four screws torqued to 5 lb-in.

10. The modular hybrid assembly according to claim 1, further comprising an isolation lid attached to the second surface of the high frequency substrate and substantially encasing the customizable circuit region.

11. A high frequency input/output planar launch for a modular circuit assembly, the modular circuit assembly having a high frequency substrate with a first surface, a second surface opposed to the first surface and having a customizable circuit region, and an edge, a leadframe attached to the first surface, the leadframe having a plurality of conductors, the plurality of conductors extending horizontally from the edge and first surface, and clamping means for demountably attaching the modular circuit assembly to the motherboard, the planar launch comprising:

conductive means for electrically connecting a customizable circuit region and a plurality of signal lines on the motherboard, the conductive means being customizable and having a predetermined controlled impedance.

12. The high frequency input/output planar launch according to claim 11, wherein the conductive means comprises:

a leadframe coplanar waveguide transmission line connected to the first surface of the substrate, the transmission line having geometrically controlled impedance, the coplanar waveguide being defined on a standardized leadframe interconnect which is compressed between the first and second surfaces.

13. A high frequency input/output planar launch for a modular circuit assembly, the modular circuit assembly having a high frequency substrate with a first surface, a second surface opposed to the first surface and having a customizable circuit region, and an edge, a leadframe attached to the first surface, the leadframe having a plurality of conductors, the plurality of conductors extending horizontally from the edge and first surface, and clamping means for demountably attaching the modular circuit assembly to the motherboard, the planar launch comprising:

conductive means for electrically connecting the customizable circuit region and a plurality of signal lines on the motherboard, the conductive means comprising a leadframe coplanar waveguide transmission line connected to the first surface of the substrate, the coplanar waveguide being defined on a standardized leadframe interconnect which is compressed between the first and second surfaces, the coplanar waveguide transmission line comprising (i) an RF signal lead having an elongated section, a stub length having first and second ends, the first end being connected to one end of the elongated section, and a partially circular portion connected to the second end of the stub length, the partially circular portion having an aperture; and (ii) a ground lead disposed substantially around the RF signal lead, the ground lead having first and second elongated sections and an arc-shaped portion such that the first and second elongated sections are disposed on either side of the RF signal lead and the arc-shaped portion is concentrically positioned with the partially circular portion.

14. The high frequency input/output planar launch as recited in claim 13, wherein the leadframe coplanar waveguide transmission line is compressed between the first and second surfaces by an elastomeric member.

15. The high frequency input/output planar launch as recited in claim 14, wherein the controlled impedance is 50 ohms.

16. A demountable modular hybrid circuit, comprising:

a motherboard having a first surface, said first surface having a plurality of assembly connection sites, said motherboard further comprising a plurality of microwave signal lines;

a plurality of high frequency substrate components each having first and second surfaces, said second surface opposed to said first surface, said first surface having a leadframe attached thereto, said second surface having a customizable circuit region;

a plurality of conductive means for electrically connecting the leadframe and customizable circuit region of said plurality of high frequency substrate components; and a plurality of clamping means for demountably attaching the plurality of the high frequency substrate components to the motherboard.

* * * * *